(12) United States Patent
Song et al.

(10) Patent No.: US 8,237,236 B2
(45) Date of Patent: Aug. 7, 2012

(54) INSB-BASED SWITCHING DEVICE

(75) Inventors: Jin Dong Song, Seoul (KR); Sung Jung Joo, Seoul (KR); Jin Ki Hong, Seoul (KR); Sang Hoon Shin, Busan (KR); Kyung Ho Shin, Seoul (KR); Tae Yueb Kim, Seoul (KR); Ju Young Lim, Ulsan (KR); Jin Seo Lee, Ansan-si (KR); Kung Won Rhie, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 166 days.

(21) Appl. No.: 12/762,839

(22) Filed: Apr. 19, 2010

(65) Prior Publication Data

US 2010/0308378 A1      Dec. 9, 2010

(30) Foreign Application Priority Data

Jun. 3, 2009  (KR) .................. 10-2009-0049102
Nov. 19, 2009 (KR) .................. 10-2009-0112005

(51) Int. Cl.
*H01L 29/82* (2006.01)

(52) U.S. Cl. ................ 257/421; 257/E29.323
(58) Field of Classification Search .......... 257/252, 257/421, E29.323, 414, 422, 425
See application file for complete search history.

(56) References Cited

U.S. PATENT DOCUMENTS

2005/0121700 A1* 6/2005 Li et al. ................. 257/245
2008/0308844 A1* 12/2008 Koo et al. ............... 257/192

OTHER PUBLICATIONS

Kothari et al., "Architecture of a Self-Checkpointing Microprocessor that Incorporates Nanomagnetic Devices", 2007, IEEE Transactions on Computers, vol. 56, No. 2, pp. 161-173, Feb. 2007.
N. Bruchon et al., "Magnetic Remanent Memory Structures for Dynamically Reconfigurable FPGA", 2005, IEEE, pp. 687-690, Jul. 2005.
Sahoo et al., "Electric Field Control of Spin Transport", 2005, Nature Publishing Group, vol. 1, pp. 99-102, Nov. 2005.
D.A. Allwood et al., "Magnetic Domain-Wall Logic", 2005, Science, vol. 309, pp. 1688-1692, Sep. 2005.
Zutic et al., "A Path to Spin Logic", 2005, Nature Publishing Group, vol. 1, pp. 85-86, Nov. 2005.
H. Dery et al., "Spin-Based Logic in Semiconductors for Reconfigurable Large-Scale Circuits", 2007, Nature Publishing Group, vol. 447, pp. 573-576, May 2007.

(Continued)

*Primary Examiner* — A. Sefer
*Assistant Examiner* — Nikolay Yushin
(74) *Attorney, Agent, or Firm* — NSIP Law

(57) ABSTRACT

An InSb-based switching device, which operates at room temperature by using a magnetic field controlled avalanche process for applying to magneto-logic elements, is provided. A switching device of one embodiment includes a p-type semiconductor layer; an n-type semiconductor layer; and contact layers disposed on one of the p-type and n-type semiconductor layers, the p-type semiconductor layer being in contact with the n-type semiconductor layer such that a current can be applied through the contact layers to the p-type and n-type semiconductor layers to cause a current flow from one of the contact layers to the p-type and n-type semiconductor layers and from the p-type and n-type semiconductor layers to the other of the contact layers, whereby the current flow can be controlled by an intensity of a magnetic field applied to the p-type and n-type semiconductor layers substantially perpendicularly thereto.

18 Claims, 7 Drawing Sheets

OTHER PUBLICATIONS

A. Ney et al., "Programmable Computing with a Single Magnetoresistive Element", 2003, Nature Publishing Group, vol. 425, pp. 485-487, Oct. 2003.

Hai et al., "Reconfigurable Logic Gates Using Single-Electron Spin Transistors", 2007, Japanese Journal of Applied Physics, vol. 46, No. 10A, pp. 6579-6585, Oct. 2007.

Hoink et al., "Reconfigurable Magnetic Logic for All Basic Logic Functions Produced by Ion Bombardment Induced Magnetic Patterning", 2007, Applied Physics Letters, vol. 91, pp. 162505-1-162505-3, Oct. 2007.

A. Ney et al., "Reconfigurable Magnetologic Computing Using the Spin Flop Switching of a Magnetic Random Access Memory Cell", 2005, Applied Physics Letters, vol. 86, pp. 013502-1-013502-3, May 2005.

A. Ney, "Reconfigurable Magnetologic Computing Using MRAM Cells", 2007, IEEE, pp. 605-608, Feb. 2007.

* cited by examiner

Edge current through skipping orbit

Promote Avalanche process

Promote Avalanche process

INSB-BASED SWITCHING DEVICE

The present application claims priority from Korean Patent Application Nos. 10-2009-49102 and 10-2009-112005 filed on Jun. 3, 2009 and Nov. 19, 2009, respectively, the entire subject matters of which are incorporated herein by reference.

TECHNICAL FIELD

The following description relates to a semiconductor device, and, for example, to an InSb based switching device operating at room temperature.

BACKGROUND

Computing performance has remarkably developed over the decades in line with the development of transistor integration technology. However, according to the International Technology Roadmap for Semiconductors (ITRS), it is predicted that the above silicon integration-based development is now approaching its physical limitations. As a substitute technology, various techniques such as spintronics, single electron transistor (SET), molecular electronic RTD, and NANO CMOS have been actively studied recently. Meanwhile, image processing devices on cellular telephones and other such devices require parallel operations, faster interaction between logical functions and memories, resettable logical functions, and the above requirements are expected to be imposed upon a general personal computer.

A CPU of a computer is a digital engine constructed on a single semiconductor chip based on transistor technology. Digital circuits, which include Complementary Metal Oxide Semiconductors (CMOS) have 2 logical circuits. One of the circuits is a combination logic circuit and the other is a sequential logic circuit. The combination logic circuit includes a combination of logic circuits, such as NAND, NOR and XOR gates, and output result of the operation immediately. The sequential logic circuits include a storage, such as a latch or a resistor for storing the interim operation results, so that the circuit can perform a series of operations sequentially and output the final result of the operations. The sequential logic circuits store outputs of the combination logic circuits to allow the output of the next stage to be determined based on the current output as well as the current input, thus implementing a complex logic circuit, which cannot be implemented only with combination logic circuits.

A magneto-logic device, which is to be substituted for the conventional CMOS logic device is being widely studied (A. Ney, "Reconfigurable magnetologic computing using MRAM cells," Proceeding of International Conference on Electromagnetics in Advanced Applications, ICEAA (2007)). The magneto-logic device adopts a Magneto-resistive Random Access Memory, which has been recently used as an information storage element for implementing a logic circuit A magneto-logic device is a device manufactured such that the direction of magnetization of a ferromagnetic material the device is made of, which is less than a submicron, corresponds to a Boolean logic "1" or "0." The input corresponds to the direction of magnetization of a ferromagnetic material the device is made of, and the output may correspond to a current, voltage or direction of magnetization of the output stage.

In the magneto-logic device, data operations and storage are performed at the same place, compared to the conventional logic device where data operations and storage are performed at different places. Such characteristics of the magneto-logic device may be attributed to its non-volatility and reconfigurability of stored data.

An effective magneto-logic device makes it possible to perform parallel operations, increases the operational speed and decreases the energy dissipation rate through faster interaction between the logical operating part and a memory, and quickly reconfiguring logic. Therefore, the chip applying the above can perform various functions in a single chip.

The magneto-logic device is a cutting edge device whose concept appeared in the early 2000s, and its experimental studies started recently. Various international research teams are organized to conduct the research for implementing the magneto-logic device. Many magneto-logic devices based on various principles have been introduced, some of which are briefly mentioned below.

The Paul Drude Institute team of Germany introduced an epoch-making magneto-logic device based on the magnetic tunneling junction (MTJ) phenomenon (A. Ney, C. Pampuch, R. Koch and K. H. Ploog, "Programmable computing with a single magnetoresistive element," Nature, page 485 (2003); A. Ney, J. S. Harris, "Reconfigurable magnetologic computing using the spin flop switching of a magnetic random access memory cell," Applied Physics Letters 86, 013502 (2005)). University of Bielefeld of Germany, which is the main team member of the European Consortium for researching the magneto-logic device, introduced a method of implementing most of the logic gates with 2 MTJs, which is one of the early achievements of this research (V. Hoink, D. Meyners, J. Schmalhorst, G Reiss, D. Junk, D. Engel and A. Ehresmann, "Reconfigurable magnetic logic for all basic logic functions produced by ion bombardment induced magnetic patterning" Applied Physics Letters 91, 162505 (2007)).

LIRMM University of Montpellier of France developed a device based on the conventional FPGA (field programmable gate array) technology as well as spin technology by combining an FPGA with a MTJ. The above research was evaluated as the most practical method for combining the MTJ technology with the current semiconductor technology (N. Bruchon, G. Cambon, L. Torres, and G. Sassatelli, "Magnetic Remanent Memory Structures for Dynamically Reconfigurable FPGA," Proceedings of 2005 International Conference on Field Programmable Logic and Applications, page 687 (2005)). Although the idea of making the magneto-logic device reprogrammable is excellent and the current research on the magneto-logic device with MTJ is actively in progress, it cannot be ensured that the above research will turn out to be effective because the magnetic resistance is too small to construct an array structure such as a CMOS for a logic gate. Also, flexibility will be lost if multilayer input structure MTJ devices are interconnected for implementing the magneto-logic device, and the wiring will be complicated if the independent input lines are connected. Moreover, since a non-uniform operating current is needed, 3 layers of the metal input lines insulated from each other must be stacked on the stacked MTJ device and this process is generally difficult.

Moreover, University of California, San Diego of the US introduced a method for converting the spin accumulation infused in the semiconductor into electrical signals and applying them to the logic circuit. This technology was evaluated to be good in terms of its originality and adoptability in converting the spin accumulation into electrical signals (H. Dery, P. Dalal, L. Cywinski and L. J. Sham, "Spin-based logic in semiconductors for reconfigurable large-scale circuits," Nature, page 573 (2007)). However, this technology is associated with a problem that its embodiment is conditioned upon the spin infusion, which is known as being hard to achieve in the spintronics.

Also, University of Illinois at Urbana-Champaign of the US introduced a device using a hole effect based on the micro magnet formed on the semiconductor, that is, a device using a hole device on a conventional CMOS, and implemented it into a logic gate (L. Kothari, and N. P. Carter, "Architecture of a Self-Checkpointing Microprocessor that Incorporates Nanomagnetic Devices," IEEE Transaction on computers 56, 161 (2007)). The above technology is considerable in terms of forming a local magnetic field of a micro magnet. However, the device in accordance with this technology is not a 100% magneto-logic device because a conventional CMOS device is used in the reconfiguration function.

Various other technologies have been introduced for implementing a magneto logic device such as domain wall motions technology (D. A. Allwood, G. Xiong, C. C. Faulkner, D. Atkinson, D. Petit, R. P. Cowburn, "Magnetic Domain-Wall Logic," Science 309, page 1688 (2005)); carbon nano tube (I. Zutic and M. Fuhrer, "Spintronics—A path to spin logic," Nature Physics, page 85 (2005); S. Sahoo, et al., "Electric field control of spin transport," Nature Physics, page 99 (2005)), single electron transistor technology (P. N. Hai, S. Sugahara and M. Tanaka, "Reconfigurable Logic Gates Using Single-Electron Spin Transistors," Japanese Journal of Applied Physics 46, page 6579 (2007)). However, these technologies are no more than academic research and have lots of problems. For example, they require massive power and they are difficult to produce on a large scale, and they are practicable only under cryogenic conditions.

The above technologies have common problems to be solved as follows. First, since the assembly of various unit logic devices in an array forms a logic circuit, the on/off distinction capability of the unit logic device must be good. However, the on/off discrimination ratio of the unit logic device based on the above technologies such as MTJ, spin accumulation, and domain wall motion technology is not large enough making it impossible to form an array type logic device with the above technologies. Moreover, since magneto logic devices using the above technologies is operable only under cryogenic conditions, it is necessary to raise the operable temperature of the logic devices to room temperature.

SUMMARY

The following description relates to an InSb-based switching device operating at room temperature by using a magnetic field controlled avalanche process and a method for forming the same for applying to magneto-logic elements.

A switching device in one embodiment includes a p-type semiconductor layer; an n-type semiconductor layer; and contact layers disposed on one of the p-type and n-type semiconductor layers, the p-type semiconductor layer being in contact with the n-type semiconductor layer such that a current can be applied through the contact layers to the p-type and n-type semiconductor layers to cause a current flow from one of the contact layers to the p-type and n-type semiconductor layers and from the p-type and n-type semiconductor layers to the other of the contact layers, whereby the current flow can be controlled by an intensity of a magnetic field applied to the p-type and n-type semiconductor layers substantially perpendicularly thereto.

A switching device in another embodiment includes a p-type semiconductor layer; an n-type semiconductor layer; and contact layers disposed on one of the p-type and n-type semiconductor layers, the p-type semiconductor layer being in contact with the n-type semiconductor layer such that a current can be applied through the contact layers to the p-type and n-type semiconductor layers to cause a current flow from one of the contact layers to the p-type and n-type semiconductor layers and from the p-type and n-type semiconductor layers to the other of the contact layers, whereby the current flow can be controlled by an intensity of a magnetic field applied to the p-type and n-type semiconductor layers substantially in parallel therewith and substantially perpendicularly to the current flow.

According to another embodiment, the current flow can be decreased by increasing the intensity of the magnetic field.

In another embodiment, the switching device further includes a buffer layer in contact with the other of the p-type and n-type semiconductor layers and a semiconductor substrate in contact with the buffer layer.

According to another embodiment, the n-type semiconductor is disposed on the p-type semiconductor and the contact layers are disposed on the n-type semiconductor and have an electrical connection to a voltage source.

In another embodiment, the switching device further includes a gate disposed on the n-type semiconductor.

According to another embodiment, a thickness of the p-type semiconductor is about 6 μm and a doping density of the p-type semiconductor is about $4.448 \times 10^{17}/cm^3$.

In another embodiment, a thickness of the n-type semiconductor is about 0.2 μm and a doping density of the n-type semiconductor is about $2.7 \times 10^{16}/cm^3$.

According to another embodiment, the contact layers are formed of a single layer film of In or a multilayer film of Ti/Au/In.

In another embodiment, the semiconductor substrate includes a conductor or a semi-insulating or semi-conduction semiconductor formed of materials selected from the group consisting of GaAs, InP, Si, Ge, GaP, Sapphire, ceramic, glass and quartz.

According to another embodiment, the buffer layer includes InGaP or AlGaP if the semiconductor substrate is formed of GaAs; the buffer layer includes InAlAs if the semiconductor substrate is formed of InP; the buffer layer includes Ga(Al)N if the semiconductor substrate is formed of sapphire; and the buffer layer includes SiOx, SiNx, Ga(Al)N if the semiconductor substrate is formed of Si.

In another embodiment, the p-type semiconductor includes an InSb semiconductor doped with Be and the n-type semiconductor having undoped InSb.

This Summary is provided to introduce a selection of concepts in a simplified form that are further described below in the Detailed Description. This Summary is not intended to identify key or essential features of the claimed subject matter, nor is it intended to be used in determining the scope of the claimed subject matter.

DETAILED DESCRIPTION

A detailed description is provided below with reference to the accompanying drawings. One of ordinary skill in the art may realize that the following description is illustrative only and is not in any way limiting. Other embodiments may readily suggest themselves to such skilled persons having the benefit of this disclosure. Further, known constitutions or facts are not illustrated in order not to obscure the following description.

Figure 1:
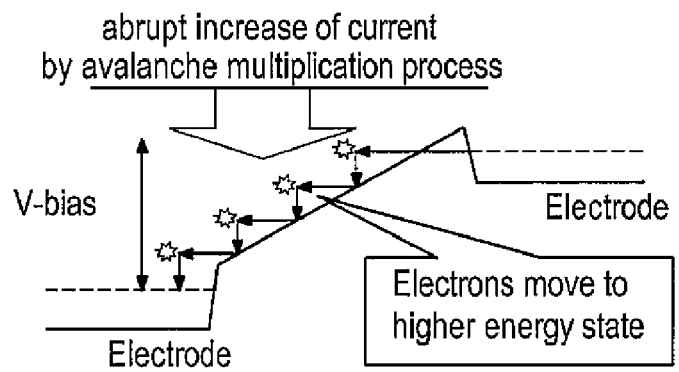
FIG. 1 illustrates an avalanche process according to an embodiment.
Figure 2:
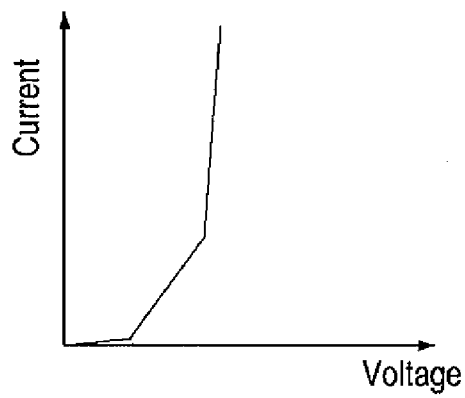
FIG. 2 illustrates current flow at the semiconductor according to an outside voltage according to an embodiment.

FIG. 1 illustrates an avalanche process and FIG. 2 illustrates a current flow at the semiconductor according to an outside voltage, according to an embodiment. The avalanche process at the semiconductor refers to a phenomenon where additional free electrons are formed through a collision between the free electrons and atoms. The collision occurs when free electrons are accelerated to exceed a certain velocity by the magnetic field formed from an outside voltage such that the electrons obtain enough kinetic energy. If the magnetic field is large enough, the amount of free electrons in the semiconductor exponentially increase because the original free electrons and the newly formed additional electrons both accelerate. When shown from the exterior, the semiconductor operates like a switch as the current abruptly increases at a certain voltage level as shown in FIG. 2. This phenomenon is common in the semiconductor, and it easily occurs when the mobility of charges (especially electrons) is high.

Figure 3:
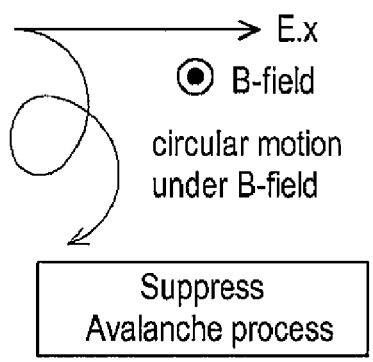
FIG. 3 illustrates that an avalanche process is suppressed by a circular electronic motion when a magnetic field is applied according to an embodiment.

As illustrated in FIG. 3, free electrons make circular motion in the magnetic field if the outside magnetic field (B-field) is applied perpendicular to the moving direction of the free electrons ($E_x$). As time goes by, the kinetic energy of the free electrons decrease and the avalanche process is suppressed.

Figure 4:
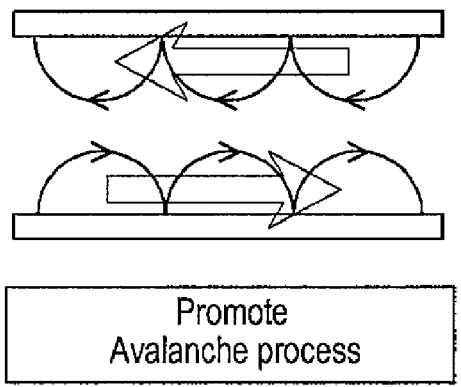
FIG. 4 illustrates that an avalanche process is affected by the width of the device when a magnetic field is applied according to an embodiment.

If the width of the device decreases as illustrated in FIG. 4, the percentage of electrons which jumps through an edge state of the walls of the device, increases. Since this phenomenon is not affected by an orbital movement of electrons due to a magnetic field, the avalanche progress is promoted. That is, as the width of the device gets narrower, the avalanche progress is promoted.

Figure 5:
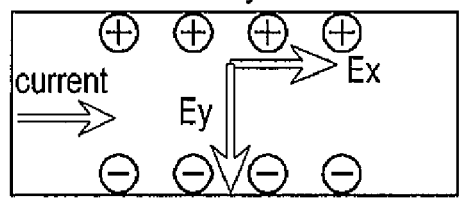
FIG. 5 illustrates that an avalanche process is promoted by a Hall field formed by a magnetic field according to an embodiment.

FIG. 5 illustrates that an avalanche process is promoted by a Hall field formed by a magnetic field according to an embodiment. If the magnetic field is applied, Hall field ($E_y$) is formed according to the redistribution of the electrons in the devices. At this moment, free electrons are accelerated by the sum of the Hall field ($E_y$) and electric field ($E_x$) of the applied voltage. Then, as electrons accelerate, kinetic energy also increases, and thus, an avalanche progress is promoted.

Figure 6:
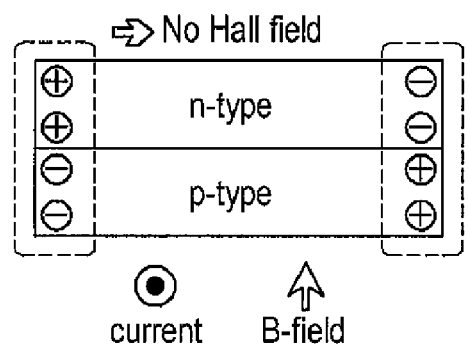
FIG. 6 illustrates a method for reducing the Hall effect according to an embodiment.

FIG. 6 is an illustrative diagram that indicates the direction of the design for the device. As shown in FIG. 6, suppose that an n-type semiconductor is disposed on a p-type semiconductor and the magnetic field is applied perpendicular to the semiconductor device, for example, in the direction of bottom to top (B-field 1). At p-type semiconductor, right portion of the device will have a positive polarity and left portion of the device will have negative polarity, so that Hall field will be formed in a right to left direction, whereas at the n-type semiconductor portion, a left portion of the device will have a positive polarity and the right portion of the device will have a negative polarity, so that the Hall field will be formed in a left to right direction. Thus, the Hall field due to the magnetic field at the n-type and p-type semiconductor will cancel each other out. Likewise, suppose that the magnetic field is applied perpendicularly to the semiconductor device, for example, in the direction of top to bottom. At the p-type semiconductor portion, a left portion of the device will have positive polarity and a right portion of the device will have negative polarity, so that the Hall field will be formed in a left to right direction, whereas at the n-type semiconductor portion, a right portion of the device will have positive polarity and a left portion of the device will have a negative polarity, so that the Hall field will be formed in a right to left direction. Thus, the Hall field due to the magnetic field at the n-type and the p-type semiconductor will cancel each other out.

In this way, the Hall effect may be suppressed and therefore an avalanche process can be prevented by disposing an n-type semiconductor on a p-type semiconductor and applying a magnetic field in the direction discussed above.

Figure 7:
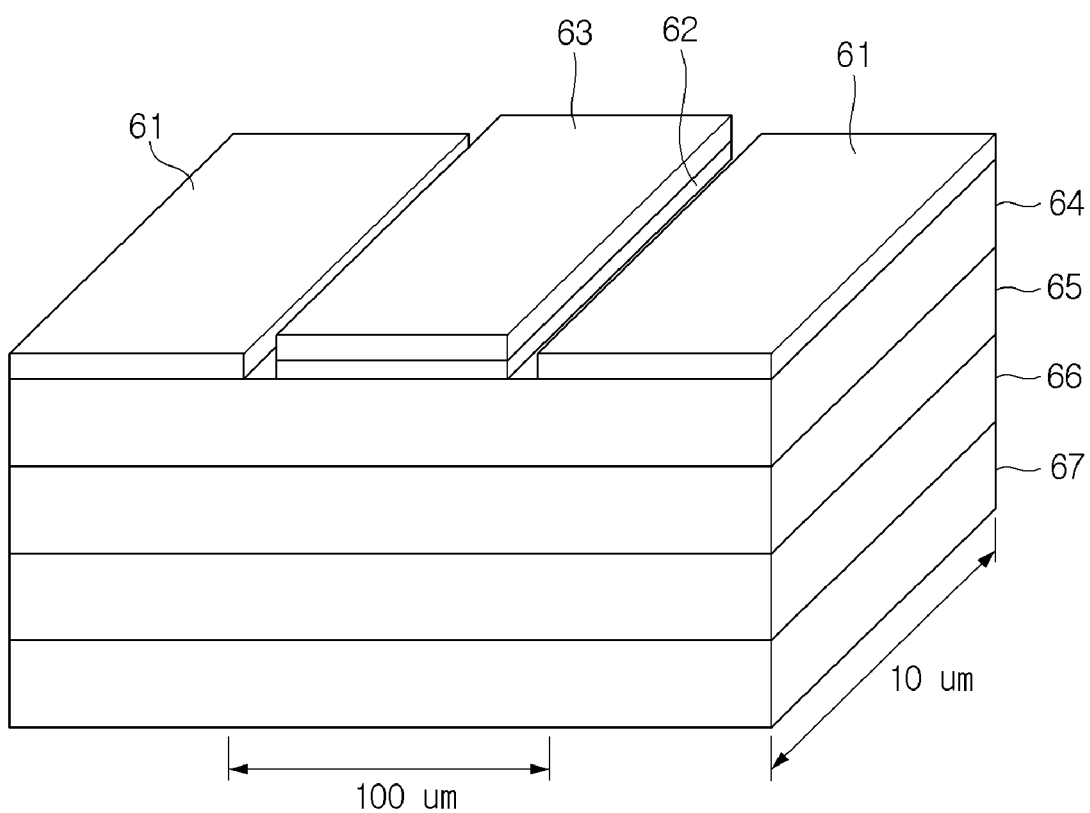
FIG. 7 illustrates a switching device according to an embodiment.

FIG. 7 illustrates a switching device according to an embodiment. According to this embodiment, InSb, which has an electron mobility of more than 40,000 $cm^2$/Vs at room temperature, may be used as a semiconductor material. According to one embodiment, the device may be constructed by using compact 21E MBE (Molecular Beam Epitaxy) which uses an ion getter pump and Cryogenic pump as a main pump. A valved cracker may be used as a As and Sb supplying source. A common K-cell may be used as an In and Ga supply source. Be may be used for p-type doping.

Semi-insulating GaAs buffer 66 may be grown to a thickness of about 300 μm at about 580° C. on a semi-insulating GaAs semiconductor substrate 67 which is removed with surface oxide film in an As atmosphere at a high temperature (e.g. about 620° C.), and then p-type InSb layer 65 may be grown on the semi-insulating GaAs buffer 66 with a thickness of about 6 μm by using Be. A doping density of p-type InSb 65 may be about $4.448 \times 10^{17}/cm^3$, and the mobility of the holes may be about 415 $cm^2$/Vs. The switching device may be formed by growing an n-type InSb layer 64, which has not been doped, on the p-type InSb layer 65 with a thickness of about 0.2 μm, where the p-type InSb layer 65 may be in contact with the n-type InSb 64, and a doping density of n-type InSb 64 may be about $2.7 \times 10^{16}/cm^3$ and the mobility of electron may be about 40,000 $cm^2$/Vs.

Then, a mesa may be formed by etching the switching device formed according to the above process with enough depth (e.g., more than 9 μm) by using a known etching process. Metal contact layer 61 may be formed to be used as an electrical connection on an n-type InSb layer 64 with a single film of In or multilayer film of Ti/Au/In by using an electron beam evaporator. Gate insulating film 62 and gate metal 63 may be formed on an n-type InSb layer 64 as a structure for measuring the characteristics of the device. The length of the device which correspond to a distance between metal contact layers 61 may be 100 μm, and the width of the device may be 10 μm.

The semiconductor substrate 67 may include a semi-insulating or semi-conduction semiconductor such as GaAs, InP, Si, Ge, GaP, Sapphire, ceramic, glass or quartz and conductor. If the semiconductor substrate 67 is GaAs, the buffer layer may be InGaP or AlGaP. If the semiconductor substrate 67 is InP, the buffer layer may be InAlAs. If the semiconductor substrate 67 is sapphire, the buffer layer may be Ga(Al)N. If the semiconductor substrate 67 is Si, the buffer layer may be SiOx, SiNx, Ga(Al)N. Further, if the substrate 67 is a p-type substrate, it may include an InSb semiconductor doped with Be, and if the substrate 67 is a n-type substrate, it may include an InSb semiconductor which is not doped.

Figure 8:
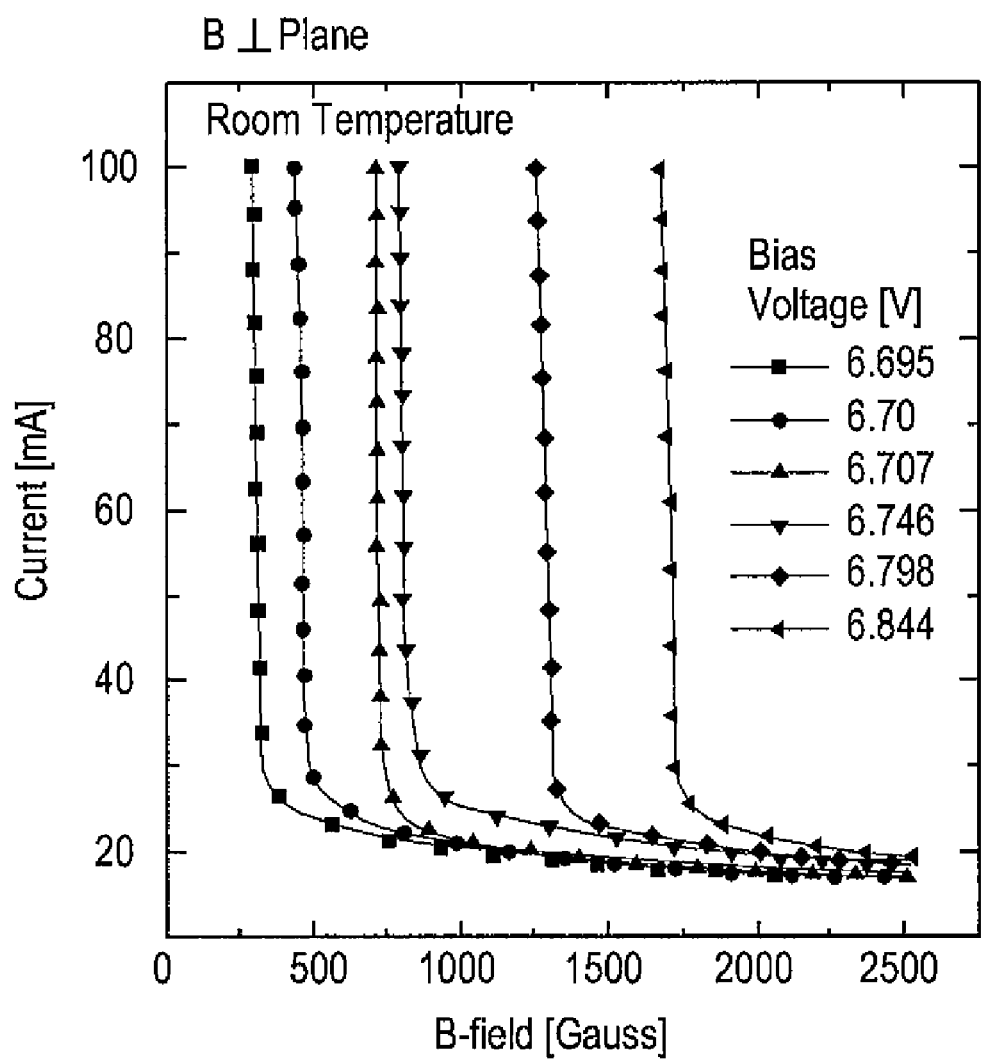
FIG. 8 to FIG. 11 illustrate current change according to an embodiment.
Figure 9:
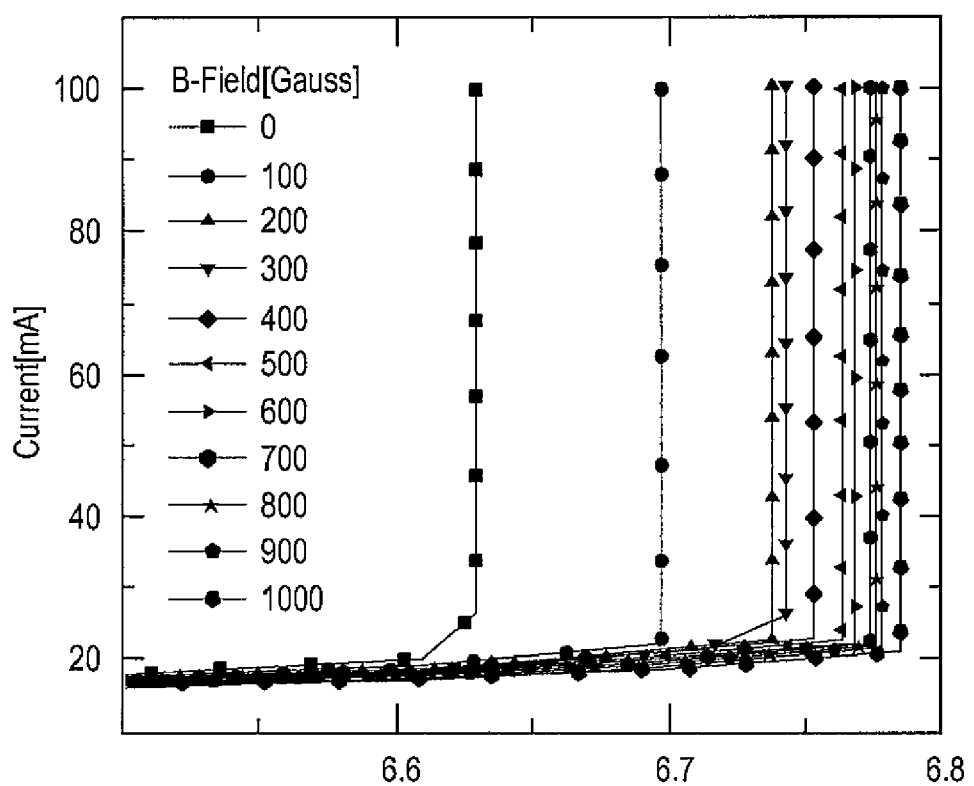

FIG. 8 illustrates current change according to the change in magnetic field between the two metal contact layers 61 when a magnetic field is perpendicularly applied to the surface of the device (see FIG. 6), and FIG. 9 illustrates current change according to the change of applied voltage between two metal contact layers 61 when the magnetic field is perpendicularly applied to the surface of the device (see FIG. 6). FIGS. 8 and 9 show that current changes abruptly at a particular voltage according to the change in magnetic field, that is, the avalanche processes are suppressed due to the suppression of the Hall field by the magnetic field. This means that a switching effect occurs at a particular voltage. The avalanche process occurs from the presence of the magnetic field at room temperature. The changing ratio of magneto-conductance is more than 400%. It also shows that Magneto-conductance changes according to the applied voltage.

Figure 10:
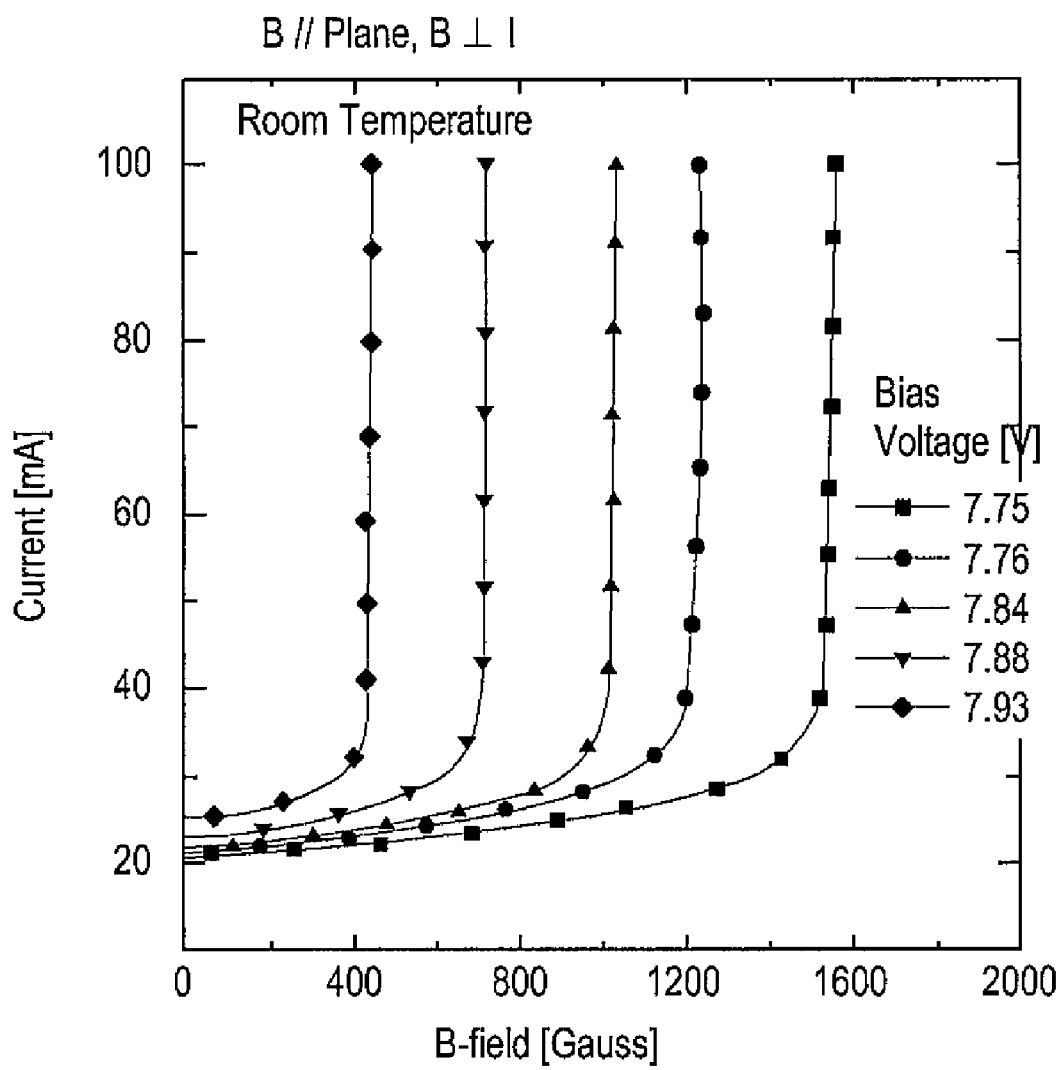
Figure 11:
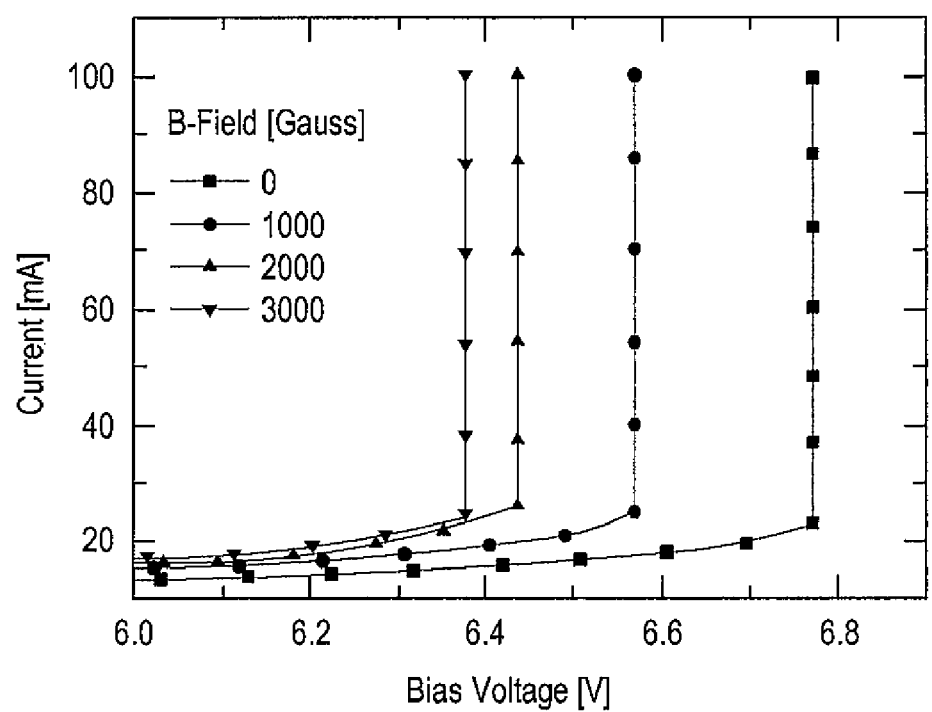

FIG. 10 illustrates current change according to the change of magnetic field between two metal contact layers 61 when a magnetic field is applied parallel to the surface of the device, and perpendicular to the direction of the current flow at the device, and FIG. 11 illustrates current change according to the change of applied voltage between two metal contact layers 61 when a magnetic field is applied parallel to the surface of the device, and perpendicular to the direction of the current flow at the device. FIGS. 10 and 11 show that current changes abruptly at a particular voltage according to the changes in the magnetic field, that is, when the magnetic field is applied parallel to the surface of the device and perpendicular to the direction of the current flow through the device, the avalanche process is promoted by the edge current compared to the case when the magnetic field is applied perpendicular to the surface of the device. This means that the switching effect occurs at a particular voltage. The avalanche process occurs from the magnetic field at room temperature. It also shows that current changes according to the applied voltage.

For example, referring to FIG. 9, suppose that 6.7 V is applied to the switching device. When the magnetic field applied to the device exceeds 200 gauss, the current flow through the device is less than 20 mA. When no magnetic field is applied, the current flow through the device is more than 100 mA. In this embodiment, the current through the device should not exceed 100 mA to protect the device from damage. The amount of current can be increased to exceed 100 mA if the device is improved so as to accommodate a large current. That is, the changing ratio of magneto-conductance will be more than 400%.

Further, FIG. 8-11 shows the current change according to the change in applied voltage and the magnetic field when the magnetic field is applied perpendicular or parallel to the surface of the device. Referring to FIG. 8-11, the direction of the current change according to the change in applied voltage and the magnetic field is selectable, which enables flexible design of the device.

The switching device enables the changing ratio of magneto-conductance to be more than 400%. The switching device can also be used as a memory or logic device because on/off operation of the device can be controlled by the magnetic field. Moreover, the device is operable at room temperature and it is non-volatile and reconfigurable.

The device can be operated at high speed of, for example, several hundreds of GHz, since the InSb has an electron mobility of more than 40,000 cm$^2$/Vs at room temperature. That is, the switching device can be used as a next generation semiconductor device in view of "function" and "operating speed." The performance of the device can be improved by upgrading the manufacturing process of the device or a design of the device. Further, the changing ratio of magneto-conductance can be increased by improving the measuring equipment since it correlates to the physical limitations of the measuring equipment.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A switching device, comprising:
   a p-type semiconductor layer;
   an n-type semiconductor layer contacting the p-type semiconductor layer; and
   contact layers disposed on one of the p-type and n-type semiconductor layers, a current flowing
   from one of the contact layers to the p-type and n-type semiconductor layers and from the p-type and n-type semiconductor layers to an other one of the contact layers when the current is applied through the contact layers,
   flow of the current being:
      controlled by an intensity of a magnetic field applied to the p-type and n-type semiconductor layers substantially perpendicularly thereto; and
      decreased by increasing the intensity of the magnetic field.

2. The switching device of claim 1, further comprising:
   a buffer layer contacting an other one of the p-type and n-type semiconductor layers; and
   a semiconductor substrate contacting the buffer layer.

3. The switching device of claim 2, wherein the semiconductor substrate includes a conductor or a semi-insulating or semi-conduction semiconductor formed of materials selected from the group consisting of GaAs, InP, Si, Ge, GaP, Sapphire, ceramic, glass and quartz.

4. The switching device of claim 3, wherein the buffer layer comprises:
   InGaP or AlGaP if the semiconductor substrate is formed of GaAs;
   InAlAs if the semiconductor substrate is formed of InP;
   Ga(Al)N if the semiconductor substrate is formed of sapphire; and
   SiOx, SiNx, Ga(Al)N if the semiconductor substrate is formed of Si.

5. The switching device of claim 2, wherein the n-type semiconductor is disposed on the p-type semiconductor and the contact layers are disposed on the n-type semiconductor and have an electrical connection to a voltage source.

6. The switching device of claim 5, wherein the contact layers are formed of a single layer film of In or a multilayer film of Ti/Au/In.

7. The switching device of claim 5, further comprising a gate disposed on the n-type semiconductor.

8. The switching device of claim 7, wherein a thickness of the p-type semiconductor is about 6 μm and a doping density of the p-type semiconductor is about 4.448×10$^{17}$/cm$^3$.

9. The switching device of claim 8, wherein a thickness of the n-type semiconductor is about 0.2 μm and a doping density of the n-type semiconductor is about 2.7×10$^{16}$/cm$^3$.

10. The switching device of claim 7, wherein the p-type semiconductor comprises an InSb semiconductor doped with Be and the n-type semiconductor comprises undoped InSb.

11. A switching device comprising:
- a p-type semiconductor layer;
- an n-type semiconductor layer; and
- contact layers disposed on one of the p-type and n-type semiconductor layers,
- the p-type semiconductor layer being in contact with the n-type semiconductor layer such that a current can be applied through the contact layers to the p-type and n-type semiconductor layers to cause a current flow from one of the contact layers to the p-type and n-type semiconductor layers and from the p-type and n-type semiconductor layers to the other of the contact layers,
- whereby the current flow can be controlled by an intensity of a magnetic field applied to the p-type and n-type semiconductor layers substantially in parallel therewith and substantially perpendicularly to the current flow.

12. The switching device of claim 11, wherein the current flow can be increased by increasing the intensity of the magnetic field.

13. The switching device of claim 12, wherein the p-type semiconductor comprises an InSb semiconductor doped with Be and the n-type semiconductor comprises undoped InSb.

14. The switching device of claim 12, wherein the n-type semiconductor is disposed on the p-type semiconductor and the contact layers are disposed on the n-type semiconductor and have an electrical connection to a voltage source.

15. The switching device of claim 14, wherein the contact layers are formed of a single layer film of In or a multilayer film of Ti/Au/In.

16. The switching device of 14, wherein a thickness of the p-type semiconductor is about 6 μm and a doping density of the p-type semiconductor is about $4.448 \times 10^{17}/cm^3$.

17. The switching device of any one of claim 16, wherein a thickness of the n-type semiconductor is about 0.2 μm and a doping density of the n-type semiconductor is about $2.7 \times 10^{16}/cm^3$.

18. A switching device, comprising:
- a p-type semiconductor layer;
- an n-type semiconductor layer contacting the p-type semiconductor layer; and
- contact layers formed of a single layer film of In or a multilayer film of Ti/Au/In, the contact layers being disposed on one of the p-type and n-type semiconductor layers, a current flowing from one of the contact layers to the p-type and n-type semiconductor layers and from the p-type and n-type semiconductor layers to an other one of the contact layers when the current is applied through the contact layers, a flow of the current being controlled by an intensity of a magnetic field applied to the p-type and n-type semiconductor layers substantially perpendicularly thereto.

* * * * *